US008710438B2

(12) United States Patent
Nakamura et al.

(10) Patent No.: US 8,710,438 B2
(45) Date of Patent: Apr. 29, 2014

(54) SCANNING TRANSMISSION ELECTRON MICROSCOPE AND AXIAL ADJUSTMENT METHOD THEREOF

(75) Inventors: Kuniyasu Nakamura, Musashino (JP); Hiromi Inada, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 13/808,134

(22) PCT Filed: Jul. 11, 2011

(86) PCT No.: PCT/JP2011/065790
§ 371 (c)(1),
(2), (4) Date: Jan. 3, 2013

(87) PCT Pub. No.: WO2012/014665
PCT Pub. Date: Feb. 2, 2012

(65) Prior Publication Data
US 2013/0112875 A1    May 9, 2013

(30) Foreign Application Priority Data
Jul. 27, 2010   (JP) .................................. 2010-167687

(51) Int. Cl.
*G21K 7/00* (2006.01)
*H01J 37/26* (2006.01)
*H01J 37/28* (2006.01)
*G01N 23/00* (2006.01)

(52) U.S. Cl.
USPC .......................................... 250/311; 250/307

(58) Field of Classification Search
USPC ............................................... 250/311, 307
See application file for complete search history.

(56) References Cited

U.S. PATENT DOCUMENTS

| 2004/0031921 A1* | 2/2004 | Kondo et al. ............... 250/311 |
| 2004/0156555 A1* | 8/2004 | Irving et al. ............... 382/274 |

(Continued)

FOREIGN PATENT DOCUMENTS

| JP | 2003-331773 A | 11/2003 |
| JP | 2006-173027 A | 6/2006 |

(Continued)

OTHER PUBLICATIONS

Journal of Electron Microscopy, vol. 54 No. 3, p. 251-278, 2005.

(Continued)

*Primary Examiner* — Jack Berman
*Assistant Examiner* — Kevin Chung
(74) *Attorney, Agent, or Firm* — Mattingly & Malur, PC

(57) ABSTRACT

A scanning transmission electron microscope equipped with an aberration corrector is capable of automatically aligning the position of a convergence aperture with the center of an optical axis irrespective of skill and experience of an operator. The scanning transmission electron microscope system includes an electron source; a condenser lens configured to converge an electron beam emitted from the electron source; a deflector configured to cause the electron beam to perform scanning on a sample; an aberration correction device configured to correct an aberration of the electron beam; a convergence aperture configured to determine a convergent angle of the electron beam; and a detector configured to detect electrons passing through or diffracted by the sample. The system acquires information on contrast of a Ronchigram formed by the electron beam passing through the sample, and determines a position of the convergence aperture on the basis of the information.

6 Claims, 6 Drawing Sheets

(a)

(b)

(56) References Cited

U.S. PATENT DOCUMENTS

| | | |
|---|---|---|
| 2007/0120055 A1* | 5/2007 | Sawada et al. ............... 250/307 |
| 2007/0158567 A1* | 7/2007 | Nakamura et al. ............ 250/311 |
| 2007/0158568 A1* | 7/2007 | Nakamura et al. ............ 250/311 |

FOREIGN PATENT DOCUMENTS

| | | | |
|---|---|---|---|
| JP | 2006-294389 A | 10/2006 | |
| JP | 2007-173132 A | 7/2007 | |
| WO | 20071125652 A1 | 8/2007 | |
| WO | 2007/125652 A1 | 11/2007 | |

OTHER PUBLICATIONS

Journal of Electron Microscopy, vol. 54 No. 3, p. 251-p. 278, 2005.

* cited by examiner

Ronchigram in case where aperture is located in inappropriate position

Ronchigram in case where aperture is located in appropriate position

Ronchigram in case where aperture is located in inappropriate position (a)

Histogram in case where aperture is located in appropriate position (b)

Ronchigram in case where aperture is located in appropriate position

Histogram in case where aperture is located in inappropriate position (a)

Ronchigram in case where aperture is located in inappropriate position

Histogram in case where aperture is located in appropriate position (b)

Appropriate position of aperture is set

Electron beam tilt condition 1

Electron beam tilt condition 2

Electron beam tilt condition 3

SCANNING TRANSMISSION ELECTRON MICROSCOPE AND AXIAL ADJUSTMENT METHOD THEREOF

TECHNICAL FIELD

The present invention relates to an electron microscope and an axial adjustment method thereof, or more specifically, to an axial adjustment method of a scanning transmission electron microscope.

BACKGROUND ART

A conventional method of adjusting a position of a convergence aperture for defining an irradiation angle in a scanning transmission electron microscope system is carried out by periodically varying a current on an objective lens and mechanically adjusting a position of a convergence aperture in such a manner as to minimize an amount of runoff of a scanning transmission image, or by aligning an optical axis of an electron beam with a position of the aperture using an electromagnetic deflector. In another method, an electron beam is stopped at a certain point on a sample while using a convergence aperture having a large hole diameter or opening a convergence aperture, and a figure appearing on an image passing through the sample is used for adjustment. The image used in the latter method is called a Ronchigram.

As shown in FIG. 2, a flat contrast region 1 located at a central part and an intense contrast region 2 in a polygonal shape located around the flat contrast region 1 are observed together in a Ronchigram obtained by a scanning transmission electron microscope equipped with an aberration corrector. The intense contrast region 2 is derived from an uncorrectable or remaining high-order aberration. The center of an optical axis exists in the flat contrast region 1, and an operator performs adjustment in such a manner as to align the center of the optical axis with the center of the convergence aperture by observing the Ronchigram.

Such a scanning transmission electron microscope equipped with an aberration corrector requires precise positional alignment of a convergence aperture. This is because if the position of the convergence aperture is not accurate, a state of convergence of an electron beam deviates from an aberration-corrected condition and resolution of a scanning transmission image may be deteriorated by introduction of a high-order aberration such as a coma aberration.

PRIOR ART DOCUMENTS

Patent Document

Patent Document 1: Japanese Patent Application Publication No. 2003-331773

Non-Patent Document

Non-patent Document 1: Journal of Electron Microscopy, Vol. 54 No. 3, p. 251-p. 278, 2005

SUMMARY OF THE INVENTION

Problems to be Solved by the Invention

In a method of aligning the position of a convergence aperture with the center of an optical axis in a scanning transmission electron microscope system equipped with an aberration corrector, positional alignment of the convergence aperture is performed on the assumption that the optical axis exists in an approximate center of a flat contrast portion of a Ronchigram. As a method of assisting a search of the optical axis, a current on an objective lens is varied either manually or automatically and the center of a change in a pattern of the Ronchigram is determined as the position of the optical axis.

However, in both methods, the position of the optical axis is visually determined. Accordingly, precision in the alignment of the position of the convergence aperture with the optical axis relies on skill and experience of an operator, and performances of the system may vary as a consequence.

Meanwhile, under a condition of adopting and using the broadest possible aberration-corrected portion as a probe, a method of selecting the entire flat contrast portion is used. However, since a boundary between a flat contrast portion of a Ronchigram and an intense contrast portion where the Ronchigram is distorted by an aberration is determined visually, it is impossible to determine a position of the convergence aperture which contains the least aberration.

In addition, a convergence aperture having a sufficiently smaller diameter than the flat contrast portion of the Ronchigram sometimes needs to be used in order to improve contrast of a scanning transmission image or to reduce electron beam damage to a sample. However, any neighboring region where an aperture is supposed to be inserted is located in the flat contrast region and it is therefore difficult to determine the position of the optical axis.

An object of the present invention is to provide a scanning transmission electron microscope equipped with an aberration corrector, which is capable of automatically aligning the position of a convergence aperture with the center of an optical axis irrespective of skill and experience of an operator.

Means for Solving the Problem

The present invention provides a scanning transmission electron microscope system, including: an electron source; a condenser lens configured to converge an electron beam emitted from the electron source; a deflector configured to cause the electron beam to perform scanning on a sample; an aberration correction device configured to correct an aberration of the electron beam; a convergence aperture configured to determine a convergence angle of the electron beam; and a detector configured to detect electrons passing through or diffracted by the sample, characterized in that the system acquires information on contrast of a Ronchigram formed by the electron beam passing through the sample, and determines a position of the convergence aperture on the basis of the information.

Effects of the Invention

According to the method of aligning the position of a convergence aperture with the center of an optical axis in a scanning transmission electron microscope equipped with an aberration corrector, the position of the optical axis can be determined irrespective of skill and experience of an operator.

As a consequence, it is possible to avoid occurrence of variations in performances of the system which are attributed to the operator, to allow adoption and use of the broadest possible aberration-corrected portion as a probe, and to align the position of a convergence aperture with the position of the optical axis even in the case of using a convergence aperture having a sufficiently smaller diameter than an aberration-corrected angular range.

MODES FOR CARRYING OUT THE INVENTION

Figure 3:
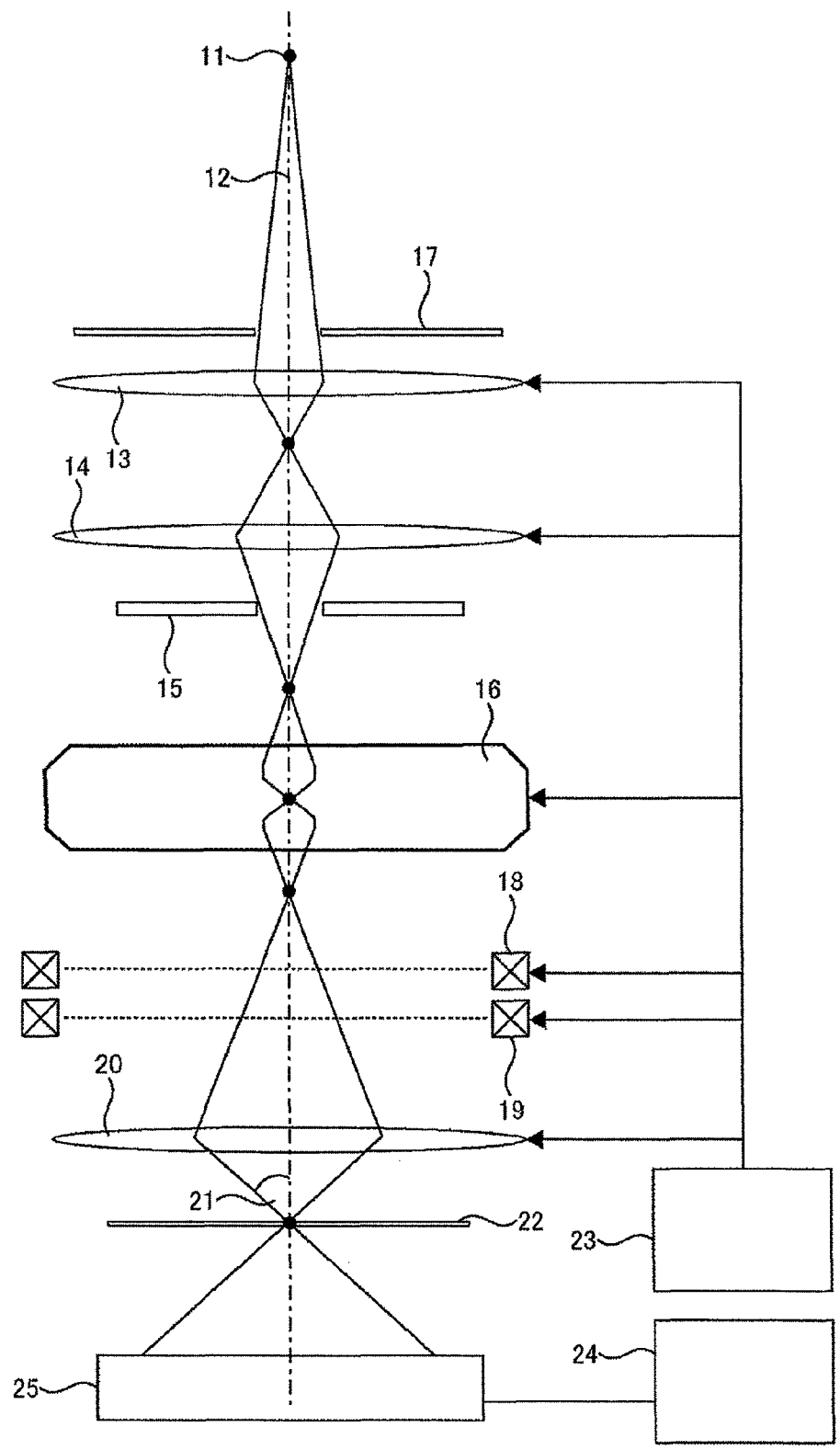
FIG. 3 is a view showing a configuration of a scanning transmission electron microscope for performing positional alignment of a convergence aperture by searching for an optical axis in a flat contrast portion in a Ronchigram.

FIG. 3 is a view explaining an electron optical system of a scanning transmission electron microscope. An electron beam emitted from a light source 11 is converged by a first stage condenser lens 13, a second stage condenser lens 14, and an objective lens 20, and thereby forms an electron beam probe on a sample 22. An aberration corrector 16 is located on an upstream of the objective lens 20 and configured to correct a spherical aberration, a chromatic aberration, and the like which occur in the electron optical system. Rotationally symmetric lenses or multipole lenses of a magnetic field type or an electrostatic type are used as these lenses.

Here, the light source means any of an electron source, an electron beam extraction electrode of an electrostatic type or a magnetic field type, and a virtual light source defined as an actual electron beam spot which is formed by an electron gum including an electrostatic acceleration electrode and the like or as a virtual electron beam spot. Conceivable modes of the electron gun include a cold cathode field-emission electron gun configured to cause field emission of an electron beam without heating an electron source, a Schottky electron gun configured to emit an electron beam by heating an electron source, and so forth.

An electron gun aperture 17 has a role in shielding an electron beam which is incident at a large angle on an optical axis 12, and may also be used as a differential evacuation aperture for protecting ultra-high vacuum in the electron gun. A convergence aperture 15 has a mechanical driving mechanism, is capable of being inserted in and retracted from the optical axis 12, and has a three-dimensional precise positioning mechanism. A purpose of using the convergence aperture 15 is to adjust an convergence angle 21 of the electron beam probe on the sample 22. A plate provided with through-holes having multiple hole diameters of about 500 μm to 10 μm is used as the convergence aperture 15, for example. Although the location of the convergence aperture 15 is defined between the second stage condenser lens 14 and the aberration corrector 16 in FIG. 3, the location of the convergence aperture 15 may be defined between the first stage condenser lens 13 and the second stage condenser lens 14, between the light source 11 and the first stage condenser lens 13, and so forth.

A first stage scanning coil 18 and a second stage scanning coil 19 have a function to deflect the electron beam away from the optical axis 12 and thereby to control the position of the electron beam probe on the sample 22. A scanning coil having the same function is disposed (not shown) in a position rotated by 90 degrees on the same planes as each of the first stage scanning coil 18 and the second stage scanning coil 19. Combined positional control of the electron beam probe using these coils enables two-dimensional scanning of the electron beam probe on the sample 22.

A scanning transmission image is formed by detecting secondary electrons emitted from the sample 22 synchronously with scanning by the electron beam and the electron beam passing through the sample 22 by a detector (not shown), and then displaying a detection result in the form of an image having a dynamic range of about 16 bits.

The lenses and the scanning coils are controlled by an electron microscope controller 23. The electron microscope controller 23 in this optical system includes a drive power supply circuit to be controlled by a CPU, software, and interfaces such as a keyboard, a mouse, and a knob for allowing an operator to control input and output.

A CCD camera 25 has a function to obtain a Ronchigram formed by the electron beam that passes through the sample 22 and is controlled by a CCD camera controller 24.

Example 1

Figure 1:
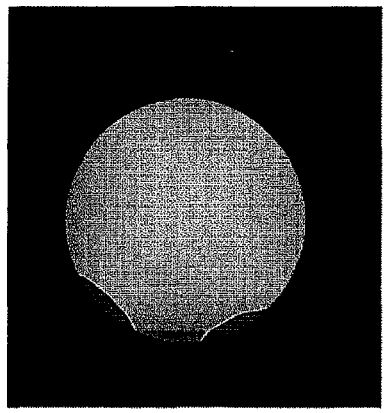
FIG. 1 is a view showing Ronchigrams and corresponding histograms in cases where a convergence aperture is located in an inappropriate position and in an appropriate position.
Figure 1:
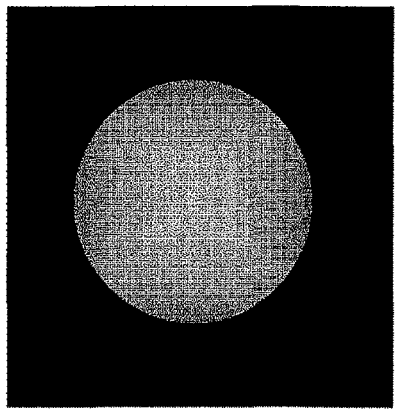
Figure 1:
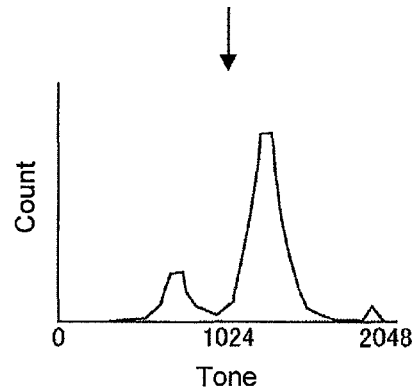
Figure 1:
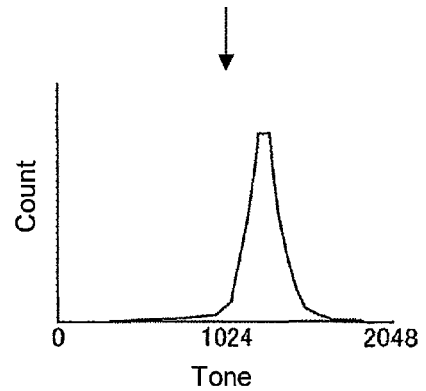
Figure 2:
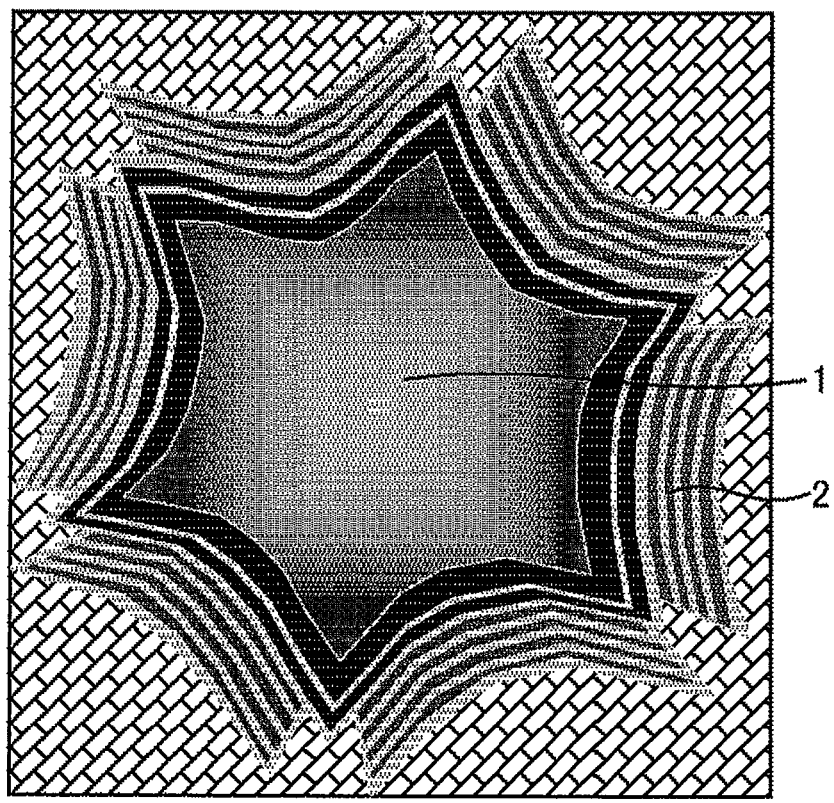
FIG. 2 is a view showing an example of a Ronchigram to be observed with a scanning transmission electron microscope equipped with an aberration corrector.

Next, a method of precise positional alignment of a convergence aperture in a scanning transmission electron microscope equipped with an aberration corrector will be described. FIG. 1 shows Ronchigrams and corresponding histograms when an aperture is inserted in a Ronchigram shown in FIG. 2. Although the aperture should be inserted in such a manner as to be aligned with the position of the optical axis, the optical axis exists in a position of the Ronchigram where its contrast is flat and it is therefore difficult to visually discriminate the most appropriate insertion position. FIG. 1(a) shows the Ronchigram when the position of the aperture is inappropriate. Here, different contrast is observed in some parts. Meanwhile, FIG. 1(b) shows the Ronchigram when the position of the aperture is appropriate. Here, uniform contrast is observed inside the aperture. By using histograms corresponding to the images in order to determine such contrast uniformity, a deviation from the optical axis can be determined on the basis of positions and levels of peaks in the histograms.

The following is a specific flow for searching the optical axis.

(1) An operator observes the Ronchigram without inserting the convergence aperture and designates a neighboring region of the center of the Ronchigram, i.e., the vicinity of an estimated optical axis.

(2) Tones in the vicinity of the area, e.g., 50×50 pixels around a designated point, are observed with the CCD camera and stored as contrast reference.

(3) The convergence aperture is automatically inserted and then the convergence aperture performs scanning on the plane using a micromotion function. The CCD camera obtains an image synchronously with the scanning and calculates a histogram.

(4) When the convergence aperture completes the scanning, the entire histogram is analyzed to eliminate positions containing a factor other than the reference tones, and a position having the flattest contrast within the entire aperture is calculated and determined as the optical axis.

(5) The convergence aperture is automatically set by a micromotion mechanism in such a manner that the determined position of the optical axis coincides with the center of the aperture.

The above-described method of determining the position of the aperture is designed to determine the position of the optical axis by using the histogram of the Ronchigram in which the aperture is inserted. However, a difference in contrast between the center and an aberration-remaining portion may be small. In such a case, the obtained Ronchigram is converted into a differential image in order to emphasize a contrast variation. Then, the optical axis can be determined by selecting a region having a small differential value in the histogram. A similar method can be used as a flow from introduction of the aperture, the determination of the optical axis, and to the automatic positional alignment of the aperture.

Example 2

Figure 4:
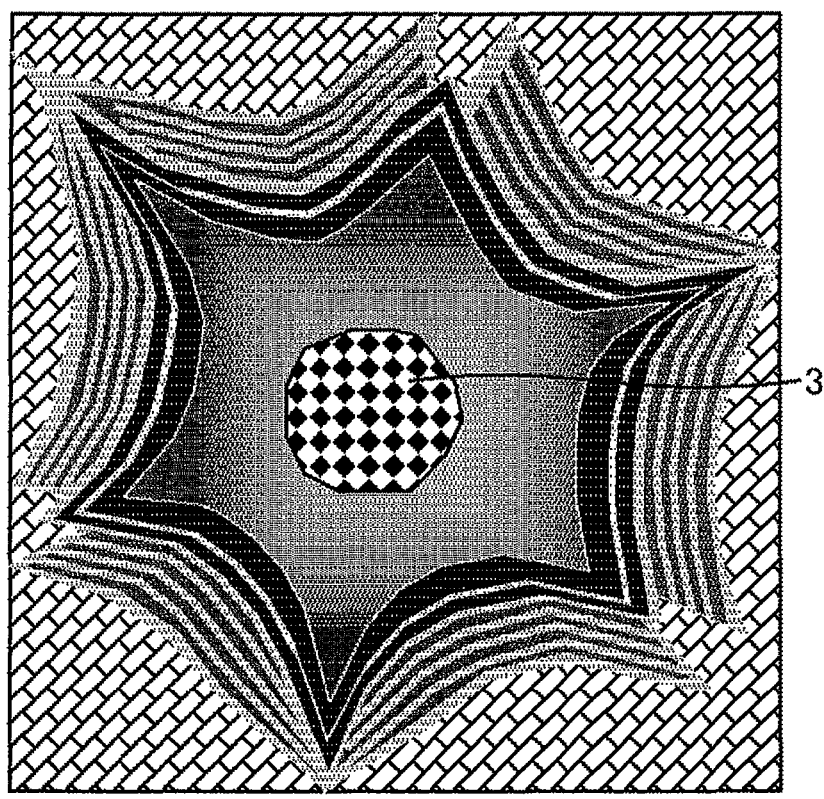
FIG. 4 is a view showing an example in the case of performing defocusing of a Ronchigram to be observed with the scanning transmission electron microscope equipped with the aberration corrector.
Figure 5:
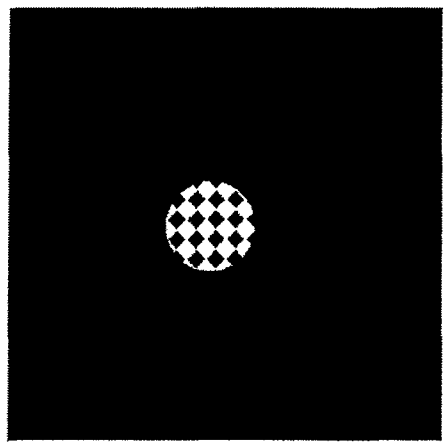
FIG. 5 is a view showing Ronchigrams and corresponding histograms in cases where a convergence aperture having a small hole diameter for setting a small irradiation angle is located in an inappropriate position and in an appropriate position.
Figure 5:
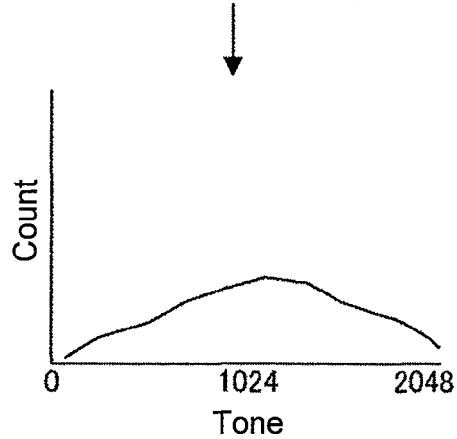
Figure 5:
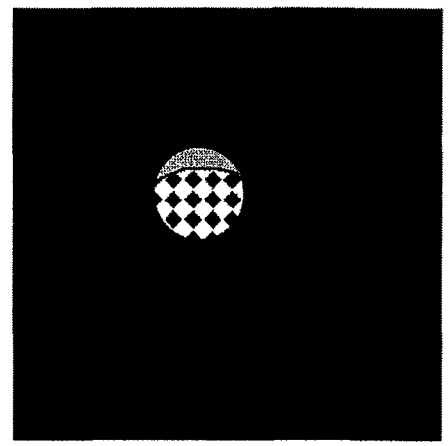
Figure 5:
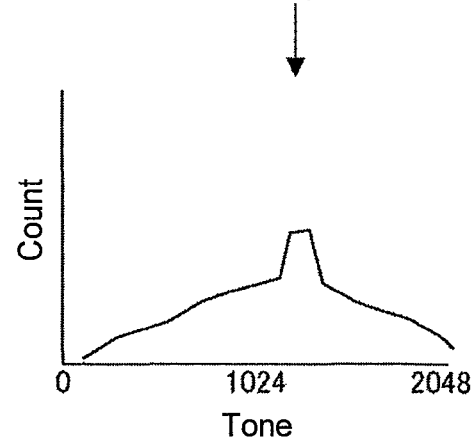

Next, description will be given of a method of determining an optical axis in the case of selecting a smaller angular range as compared to a flat contrast portion in a Ronchigram. A Ronchigram is an image which represents aberration distribution based on an angle of an electron beam, and an aperture having a small hole diameter is chosen upon selection of a small angle. In this case, when the aperture is inserted in the vicinity of the center of the Ronchigram, the contrast is flat in any neighboring position and it is not possible to accurately determine the optical axis by discerning a deviation from a tone reference position in a histogram. Here, an aspect of a change in contrast of the Ronchigram caused by performing defocusing is utilized. FIG. 4 is a Ronchigram in the case of performing defocusing. A characteristic feature therein is that an aberration attributed to defocusing forms contrast around the optical axis. Accordingly, the position of the center is discernible as a change in contrast of the Ronchigram by selecting an appropriate amount of defocusing with respect to an ultimate remaining aberration. FIG. 5 illustrates Ronchigrams obtained by inserting the aperture in the Ronchigram shown in FIG. 4 and histograms corresponding thereto. Tones spread in a wide range in the histogram corresponding to the Ronchigram in the case where the position of the convergence aperture is appropriate, whereas a peculiar peak is detected in the histogram corresponding to the Ronchigram in the case where the position of the convergence aperture is inappropriate. It is possible to align a smaller hole diameter with the optical axis by using this aspect. The flow used in conjunction with FIG. 1 can be performed similarly as a flow of automatically setting the position of the convergence aperture. A position where the peculiar point in the histogram can be eliminated most effectively is determined as the optical axis.

Example 3

Figure 6:
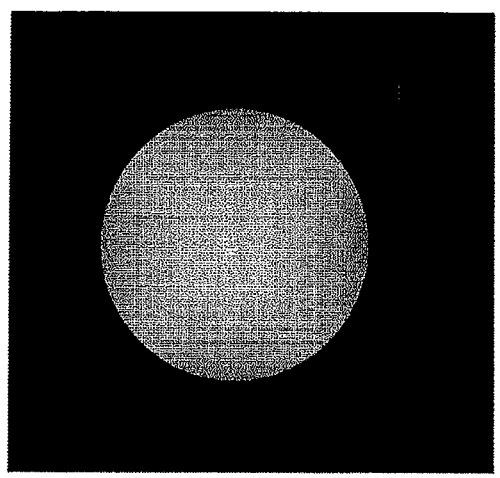
FIG. 6 is a view showing a method of capturing parts of a pattern of a Ronchigram with a convergence aperture by means of electron beam tilt and determining an optical axis in a flat contrast portion.
Figure 6:
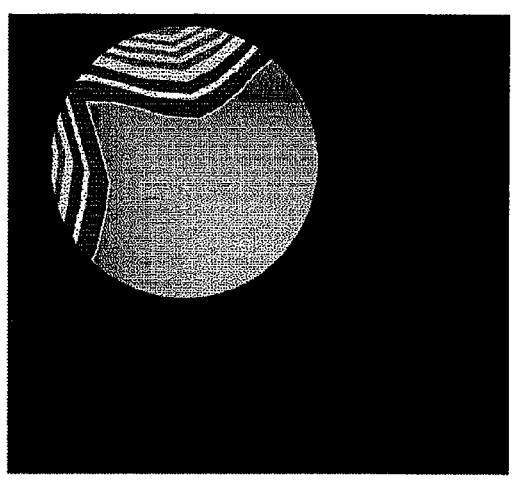
Figure 6:
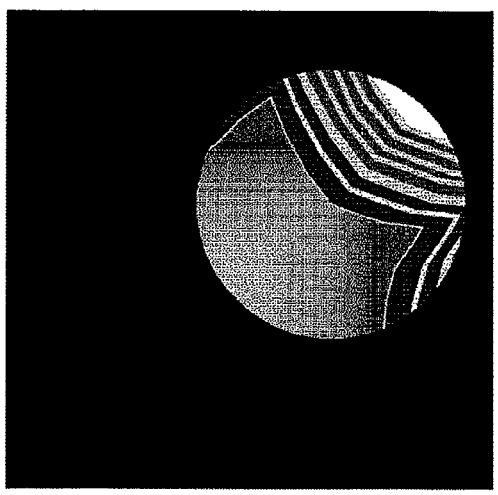
Figure 6:
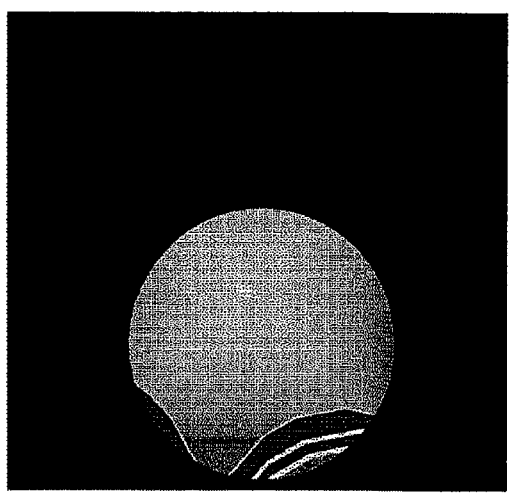

A function similar to the method of determining a position of an optical axis by mechanically changing a position of an aperture can also be achieved by means of tilt of an electron beam. FIG. 6 is a view showing a case of tilting the electron beam relative to the optical axis and capturing images in multiple positions on a Ronchigram. Here, conditions of tilt of the electron beam are set in terms of multiple directions and histograms corresponding to the respective images are analyzed. Thus, it is possible to specify the condition of tilt which achieves the most uniform contrast among the histograms.

The center of the optical axis can be aligned with the center of the convergence aperture by setting the specified condition of tilt while using deflection coils.

EXPLANATION OF REFERENCE NUMERALS 1 flat contrast region
2 intense contrast region
3 intense contrast region near center of Ronchigram subjected to defocusing
11 light source
12 optical axis
13 first stage condenser lens
14 second stage condenser lens
15 convergence aperture
16 aberration corrector
17 electron gun aperture
18 first stage scanning coil
19 second stage scanning coil
20 objective lens
21 convergence angle
22 sample
23 electron microscope controller
24 CCD camera controller
25 CCD camera

The invention claimed is:

1. A scanning transmission electron microscope system, comprising:
an electron source;
a condenser lens configured to converge an electron beam emitted from the electron source;
a deflector configured to cause the electron beam to perform scanning on a sample;
an aberration correction device configured to correct an aberration of the electron beam;
a convergence aperture configured to determine a convergent angle of the electron beam; and
a detector configured to detect electrons passing through or diffracted by the sample, wherein
the system acquires information on contrast of a Ronchigram formed by the electron beam passing through the sample, and determines a position of the convergence aperture on the basis of the information.

2. The scanning transmission electron microscope system according to claim 1, the system further comprising
an operating unit configured to create a histogram of the Ronchigram, wherein
the position of the convergence aperture is determined on the basis of the histogram.

3. The scanning transmission electron microscope system according to claim 1, the system further comprising
an operating unit configured to create a histogram of an image obtained by differentiating the Ronchigram, wherein
the position of the convergence aperture is determined on the basis of the histogram.

4. The scanning transmission electron microscope system according to claim 1, the system further comprising
a driving mechanism configured to two-dimensionally drive the convergence aperture, wherein
the information on the contrast of the Ronchigram is acquired by obtaining the Ronchigram synchronously with drive of the convergence aperture, and
the position of the convergence aperture is determined on the basis of the information.

5. The scanning transmission electron microscope system according to claim 1, wherein the Ronchigram is obtained synchronously with tilt of the electron beam, and an optical axis is determined by using a histogram of the obtained Ronchigram.

6. The scanning transmission electron microscope system according to claim 5, wherein the tilt of the electron beam is set automatically in such a manner that a position of the optical axis coincides with the position of the convergence aperture upon determination of the optical axis.

\* \* \* \* \*